United States Patent
Li

(10) Patent No.: US 10,977,122 B2
(45) Date of Patent: Apr. 13, 2021

(54) SYSTEM AND METHOD FOR FACILITATING DIFFERENTIATED ERROR CORRECTION IN HIGH-DENSITY FLASH DEVICES

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 150 days.

(21) Appl. No.: 16/237,340

(22) Filed: Dec. 31, 2018

(65) Prior Publication Data
US 2020/0210288 A1  Jul. 2, 2020

(51) Int. Cl.
*G11C 11/56* (2006.01)
*G06F 11/10* (2006.01)
(Continued)

(52) U.S. Cl.
CPC ...... *G06F 11/1072* (2013.01); *G06F 11/1044* (2013.01); *G06F 12/0246* (2013.01);
(Continued)

(58) Field of Classification Search
CPC ............. G06F 11/1072; G06F 11/1044; G06F 12/0246; G06F 2212/7202;
(Continued)

(56) References Cited

U.S. PATENT DOCUMENTS

| | | |
|---|---|---|
| 3,893,071 A | 7/1975 | Bossen |
| 4,562,494 A | 12/1985 | Bond |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS

Seongcheol, Hong and Dongkun, Shin, NAND Flash-based Disk Cache Using SLC/MLC Combined Flash Memory, School of Information and Communication Engineering, Sungkyunkwan University, Suwon, Korea (Year: 2010).*

(Continued)

*Primary Examiner* — Albert Decady
*Assistant Examiner* — Enam Ahmed
(74) *Attorney, Agent, or Firm* — Shun Yao; Park, Vaughan, Fleming & Dowler LLP

(57) ABSTRACT

Embodiments described herein provide a system for facilitating modulation-assisted error correction. The system can include a plurality of flash memory cells, an organization module, a mapping module, and a modulation module. During operation, the organization module groups bits of a cluster of cells in the plurality of flash memory cells into a first group and a second group. A respective of the first and second groups includes bits from a respective cell of the cluster of cells. The mapping module generates a modulation map that maps a subset of bits indicated by the first group in such a way that the subset of bits is repeated in a respective domain of bits indicated by the second group. The modulation module then programs user data bits in the cluster of cells based on the modulation map.

20 Claims, 14 Drawing Sheets

(51) Int. Cl.
  *G06F 12/02*  (2006.01)
  *G11C 29/52*  (2006.01)
  *G11C 16/10*  (2006.01)
  *G11C 8/12*   (2006.01)
  *G11C 29/42*  (2006.01)
  *G11C 29/04*  (2006.01)

(52) U.S. Cl.
  CPC ............... *G11C 8/12* (2013.01); *G11C 16/10* (2013.01); *G11C 29/42* (2013.01); *G11C 29/52* (2013.01); *G11C 2029/0411* (2013.01)

(58) Field of Classification Search
  CPC ......... G06F 2212/7207; G06F 12/1408; G06F 2212/1032; G06F 2212/1052; G11C 16/10; G11C 29/52; G11C 8/12; G11C 29/42; G11C 2029/0411; G11C 16/3404; G11C 11/5628; G11C 11/5642; G11C 16/349; G11C 16/0483; G11C 7/1012
  USPC .......................................................... 714/773
  See application file for complete search history.

(56) References Cited

U.S. PATENT DOCUMENTS

| | | |
|---|---|---|
| 4,718,067 A | 1/1988 | Peters |
| 4,775,932 A | 10/1988 | Oxley |
| 4,858,040 A | 8/1989 | Hazebrouck |
| 5,394,382 A | 2/1995 | Hu |
| 5,602,693 A | 2/1997 | Brunnett |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,527,544 B1 | 9/2013 | Colgrove |
| 8,751,763 B1 | 6/2014 | Ramarao |
| 8,825,937 B2 | 9/2014 | Atkisson |
| 8,832,688 B2 | 9/2014 | Tang |
| 8,868,825 B1 | 10/2014 | Hayes |
| 8,904,061 B1 | 12/2014 | O'Brien, III |
| 9,015,561 B1 | 4/2015 | Hu |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,280,472 B1 | 3/2016 | Dang |
| 9,280,487 B2 | 3/2016 | Candelaria |
| 9,311,939 B1 | 4/2016 | Mauna |
| 9,336,340 B1 | 5/2016 | Dong |
| 9,436,595 B1 | 9/2016 | Benitez |
| 9,529,601 B1 | 12/2016 | Dharmadhikari |
| 9,588,698 B1 | 3/2017 | Karamcheti |
| 9,588,977 B1 | 3/2017 | Wang |
| 9,607,631 B2 | 3/2017 | Rausch |
| 9,747,202 B1 | 8/2017 | Shaharabany |
| 9,852,076 B1 | 12/2017 | Garg |
| 9,875,053 B2 | 1/2018 | Frid |
| 9,946,596 B2 | 4/2018 | Hashimoto |
| 10,013,169 B2 | 7/2018 | Fisher |
| 10,199,066 B1 | 2/2019 | Feldman |
| 10,229,735 B1 | 3/2019 | Natarajan |
| 10,235,198 B2 | 3/2019 | Qiu |
| 10,318,467 B2 | 6/2019 | Barzik |
| 10,361,722 B2 | 7/2019 | Lee |
| 10,437,670 B1 | 10/2019 | Koltsidas |
| 10,642,522 B2 | 5/2020 | Li |
| 10,649,657 B2 | 5/2020 | Zaidman |
| 10,678,432 B1 | 6/2020 | Dreier |
| 10,756,816 B1 | 8/2020 | Dreier |
| 2001/0032324 A1 | 10/2001 | Slaughter |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0161890 A1 | 10/2002 | Chen |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0156012 A1 | 7/2006 | Beeson |
| 2007/0033323 A1 | 2/2007 | Gorobets |
| 2007/0061502 A1 | 3/2007 | Lasser |
| 2007/0101096 A1 | 5/2007 | Gorobets |
| 2007/0283081 A1 | 12/2007 | Lasser |
| 2007/0285980 A1 | 12/2007 | Shimizu |
| 2008/0034154 A1 | 2/2008 | Lee |
| 2008/0065805 A1 | 3/2008 | Wu |
| 2008/0082731 A1 | 4/2008 | Karamcheti |
| 2008/0112238 A1 | 5/2008 | Kim |
| 2008/0301532 A1* | 12/2008 | Uchikawa ............ G11C 29/52 714/773 |
| 2009/0006667 A1 | 1/2009 | Lin |
| 2009/0089544 A1 | 4/2009 | Liu |
| 2009/0113219 A1 | 4/2009 | Aharonov |
| 2009/0183052 A1 | 7/2009 | Kanno |
| 2009/0282275 A1 | 11/2009 | Yermalayeu |
| 2009/0287956 A1 | 11/2009 | Flynn |
| 2009/0307249 A1 | 12/2009 | Koifman |
| 2009/0310412 A1 | 12/2009 | Jang |
| 2010/0169470 A1 | 7/2010 | Takashige |
| 2010/0217952 A1 | 8/2010 | Iyer |
| 2010/0229224 A1 | 9/2010 | Etchegoyen |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1* | 10/2011 | Weingarten ......... G06F 11/1072 711/103 |
| 2011/0258514 A1 | 10/2011 | Lasser |
| 2011/0292538 A1 | 12/2011 | Haga |
| 2011/0296411 A1 | 12/2011 | Tang |

(56) References Cited

U.S. PATENT DOCUMENTS

| | | |
|---|---|---|
| 2011/0299317 A1 | 12/2011 | Shaeffer |
| 2011/0302353 A1 | 12/2011 | Confalonieri |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0246392 A1 | 9/2012 | Cheon |
| 2012/0278579 A1 | 11/2012 | Goss |
| 2012/0284587 A1 | 11/2012 | Yu |
| 2012/0331207 A1 | 12/2012 | Lassa |
| 2013/0024605 A1* | 1/2013 | Sharon ............. G06F 11/1044 711/103 |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0166820 A1 | 6/2013 | Batwara |
| 2013/0173845 A1 | 7/2013 | Aslam |
| 2013/0191601 A1 | 7/2013 | Peterson |
| 2013/0219131 A1 | 8/2013 | Alexandron |
| 2013/0238955 A1 | 9/2013 | D Abreu |
| 2013/0254622 A1 | 9/2013 | Kanno |
| 2013/0318283 A1 | 11/2013 | Small |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0095827 A1 | 4/2014 | Wei |
| 2014/0108414 A1 | 4/2014 | Stillerman |
| 2014/0108891 A1* | 4/2014 | Strasser ............. G06F 11/1068 714/773 |
| 2014/0164879 A1* | 6/2014 | Tam ................ G06F 11/1012 714/773 |
| 2014/0181532 A1 | 6/2014 | Camp |
| 2014/0195564 A1 | 7/2014 | Talagala |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0294684 A1 | 10/2015 | Qjang |
| 2015/0301964 A1 | 10/2015 | Brinicombe |
| 2015/0304108 A1 | 10/2015 | Obukhov |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048341 A1 | 2/2016 | Constantinescu |
| 2016/0077749 A1 | 3/2016 | Ravimohan |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0203000 A1 | 7/2016 | Parmar |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0321002 A1 | 11/2016 | Jung |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0199823 A1 | 7/2017 | Hayes |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0143780 A1 | 5/2018 | Cho |
| 2018/0165038 A1 | 6/2018 | Authement |
| 2018/0167268 A1 | 6/2018 | Liguori |
| 2018/0173620 A1 | 6/2018 | Cen |
| 2018/0188970 A1 | 7/2018 | Liu |
| 2018/0189182 A1 | 7/2018 | Wang |
| 2018/0212951 A1 | 7/2018 | Goodrum |
| 2018/0226124 A1* | 8/2018 | Perner ................ G11C 16/08 |
| 2018/0232151 A1 | 8/2018 | Badam |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0329776 A1 | 11/2018 | Lai |
| 2018/0336921 A1 | 11/2018 | Ryun |
| 2018/0356992 A1 | 12/2018 | Lamberts |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0065085 A1 | 2/2019 | Jean |

(56) References Cited

U.S. PATENT DOCUMENTS

| | | | |
|---|---|---|---|
| 2019/0073262 | A1 | 3/2019 | Chen |
| 2019/0087115 | A1 | 3/2019 | Li |
| 2019/0087328 | A1 | 3/2019 | Kanno |
| 2019/0171532 | A1 | 6/2019 | Abadi |
| 2019/0205206 | A1 | 7/2019 | Hornung |
| 2019/0227927 | A1 | 7/2019 | Miao |
| 2019/0272242 | A1 | 9/2019 | Kachare |
| 2019/0278654 | A1* | 9/2019 | Kaynak ............. H03M 13/2948 |
| 2019/0339998 | A1 | 11/2019 | Momchilov |
| 2019/0377632 | A1 | 12/2019 | Oh |
| 2019/0377821 | A1 | 12/2019 | Pleshachkov |
| 2019/0391748 | A1 | 12/2019 | Li |
| 2020/0004456 | A1 | 1/2020 | Williams |
| 2020/0004674 | A1 | 1/2020 | Williams |
| 2020/0013458 | A1* | 1/2020 | Schreck ................ G11C 11/221 |
| 2020/0042223 | A1* | 2/2020 | Li ....................... G06F 11/1072 |
| 2020/0097189 | A1 | 3/2020 | Tao |
| 2020/0159425 | A1* | 5/2020 | Flynn ......................... G06F 9/52 |
| 2020/0167091 | A1 | 5/2020 | Haridas |
| 2020/0348888 | A1 | 11/2020 | Kim |

FOREIGN PATENT DOCUMENTS

| | | |
|---|---|---|
| WO | 9418634 | 8/1994 |
| WO | 1994018634 | 8/1994 |

OTHER PUBLICATIONS

C. Wu, D. Wu, H. Chou and C. Cheng, "Rethink the Design of Flash Translation Layers in a Component-Based View", in IEEE Acess, vol. 5, pp. 12895-12912, 2017.

Po-Liang Wu, Yuan-Hao Chang and T. Kuo, "A file-system-aware FTL design for flash-memory storage systems," 2009, pp. 393-398.

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.

A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.

J. Jung and Y. Won, "nvramdisk: A Transactional Block Device Driver for Non-Volatile RAM", in IEEE Transactions on Computers, vol. 65, No. 2, pp. 589-600, Feb. 1, 2016.

Jimenex, X., Novo, D. and P. Ienne, "Pheonix:Reviving MLC Blocks as SLC to Extend NAND Flash Devices Lifetime, "Design, Automation & Text in Europe Conference & Exhibition (Date), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

EMC Powerpath Load Balancing and Failover Comparison with native MPIO operating system solutions. Feb. 2011.

https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

\* cited by examiner

SYSTEM AND METHOD FOR FACILITATING DIFFERENTIATED ERROR CORRECTION IN HIGH-DENSITY FLASH DEVICES

BACKGROUND

Field

This disclosure is generally related to the field of storage management. More specifically, this disclosure is related to a system and method for facilitating efficient error correction in high-density flash memory devices.

Related Art

The exponential growth of the Internet has made it a popular delivery medium for a variety of applications running on physical and virtual devices. Such applications have brought with them an increasing demand for computing resources. As a result, equipment vendors race to build larger and faster computing equipment (e.g., processors, storage, memory devices, etc.) with versatile capabilities. However, the capability of a piece of computing equipment cannot grow infinitely. It is limited by physical space, power consumption, and design complexity, to name a few factors. Furthermore, computing devices with higher capability are usually more complex and expensive. More importantly, because an overly large and complex system often does not provide economy of scale, simply increasing the size and capability of a computing device to accommodate higher computing demand may prove economically unviable.

Such a computing device typically needs a storage technology that can provide large storage capacity as well as efficient storage/retrieval of data. One such storage technology can be based on Not AND (NAND) flash memory devices (or flash devices). NAND flash devices can provide high capacity storage at a low cost. As a result, NAND flash devices have become the primary competitor of traditional hard disk drives (HDDs) as a persistent storage solution. To increase the capacity of a NAND flash device, more bits are represented by a single NAND flash cell in the device. For example, a triple-level cell (TLC) and a quad-level cell (QLC) can represent 3 and 4 bits, respectively. Consequently, a QLC NAND flash device maintains $2^4=16$ threshold voltage levels to denote its 4 bits.

With the increasing density, the data stored on a cell can become more vulnerable to leakage and noise, rendering long-term data retention in high-density NAND flash devices can become challenging. Maintaining the data quality and reliability of high-density NAND devices has become a significant benchmark for NAND flash device technology. As a result, a NAND flash device is typically designed in such a way that the programmed data on the device should meet a set of data retention requirements in a noisy environment for a threshold period of time.

Even though error-correction coding (ECC) has brought many desirable features of efficient data retention to NAND flash devices, many problems remain unsolved in error correction in high-density NAND cells.

SUMMARY

Embodiments described herein provide an apparatus supporting modulation-assisted error correction. The apparatus can include a plurality of flash memory cells, an organization module, a mapping module, and a modulation module. During operation, the organization module groups bits of a cluster of cells in the plurality of flash memory cells into a first group and a second group. A respective of the first and second groups includes bits from a respective cell of the cluster of cells. The mapping module generates a modulation map that maps a subset of bits indicated by the first group in such a way that the subset of bits is repeated in a respective domain of bits indicated by the second group. The modulation module then programs user data bits in the cluster of cells based on the modulation map.

In a variation on this embodiment, a number of dimensions of the modulation map corresponds to the number of cells in the cluster. A respective dimension of the modulation map corresponds to a voltage level of a cell of the cluster.

In a further variation, programming the user data bits can include determining a point corresponding to the user data bits in the modulation map and programming the voltage level of a respective cell in the cluster based on the point.

In a further variation, the apparatus includes an error-correction module that can apply a first error-correction coding (ECC) to a first subset of bits of the user data bits that are modulated for the first group and a second ECC to a second subset of bits of the user data bits that are modulated for the second group. The first ECC can detect and correct a higher bit error rate than that of the second ECC.

In a further variation, the modulation module can read the first subset of bits from the cluster of cells based on the first ECC even when the programmed voltage levels have become overlapping due to data retention over a period of time.

In a further variation, the first ECC can generate a first set of parity bits for the first subset of bits and the second ECC can generate a second set of parity bits for the second subset of bits. The number of bits in the second set of parity bits can be lower than that of the first set of parity bits.

In a further variation, the apparatus also includes a plurality of out-of-band (OOB) flash memory cells distinct from the plurality of flash memory cells. The modulation module can program one or more cells of the plurality of the OOB flash memory cells to store the first and second sets of parity bits.

In a further variation, the modulation module can switch from the first ECC to a third ECC in response to determining a bit error rate higher than the capability of the first ECC. The modulation module then applies the third ECC to the first subset of bits of the user data bits to generate a third set of parity bits for the first subset of bits and stores an overflow bit of the third set of parity bits in an empty bit in a cell of the OOB flash memory cells.

In a variation on this embodiment, a respective cell of the plurality of flash memory cells is one of: a triple-level cell (TLC) and a quad-level cell (QLC). The cluster of cells can include at least two cells.

In a variation on this embodiment, the modulation map is a two-dimensional map. The voltage levels of the first cell of the cluster of cells indicate an x axis of the modulation map and voltage levels of the second cell of the cluster of cells indicate a y axis of the modulation map.

BRIEF DESCRIPTION OF THE FIGURES

In the figures, like reference numerals refer to the same figure elements.

DETAILED DESCRIPTION

Figure 1A:
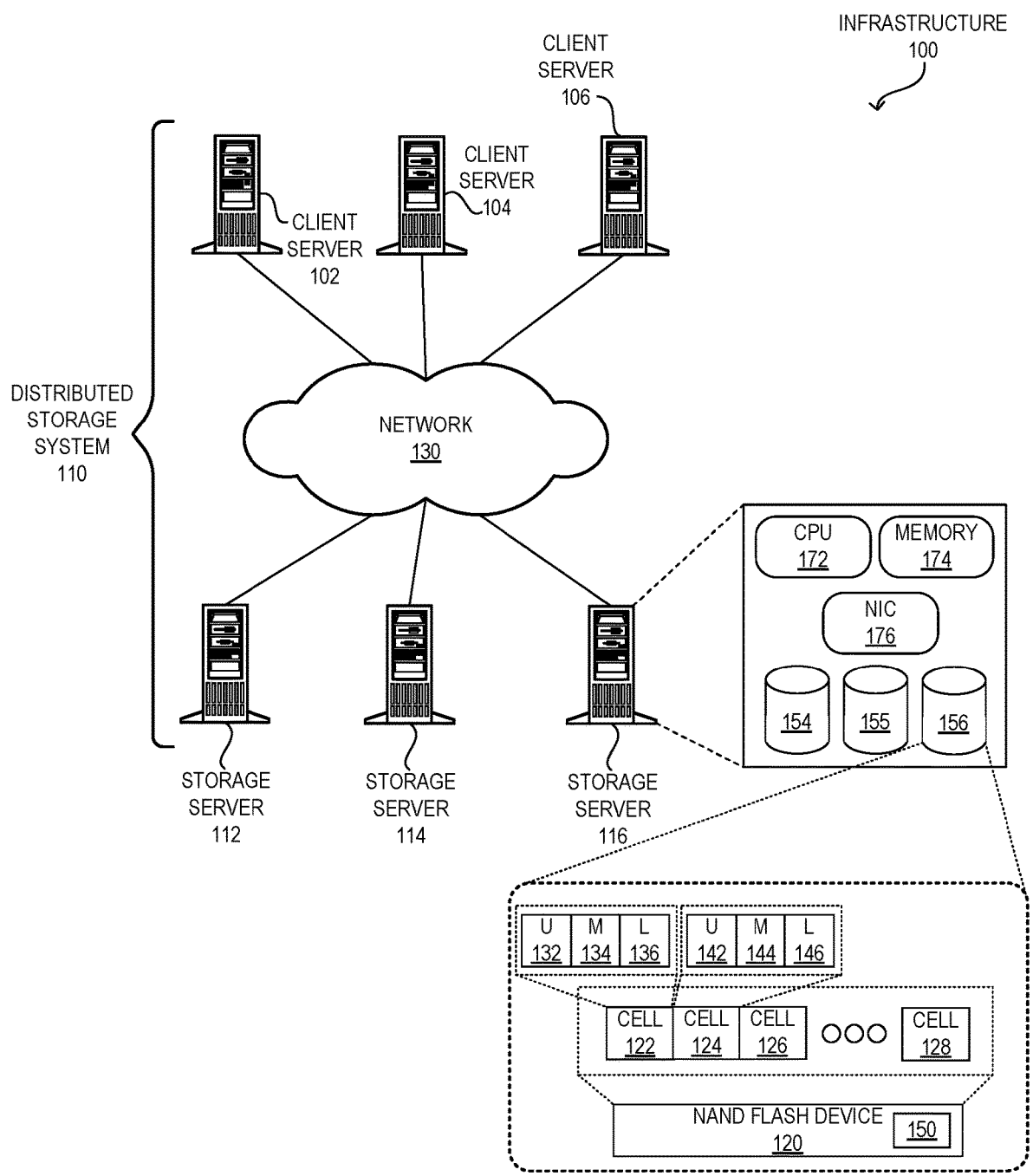
FIG. 1A illustrates an exemplary infrastructure that facilitates modulation-assisted error correction, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of providing efficient error correction for a high-density flash device by facilitating (i) a modulator-assisted error-correction coding that supports differentiated error correction for different types of bits in the flash device; and (ii) a reduced-dimension error-correction coding that can accommodate overflow parity bits based on parity difference of modulation-assisted error-correction.

With existing technologies, high-density flash devices, such as high-density NAND flash devices, typically use triple-level cells (TLCs) and quad-level cells (QLCs) for representing data bits. These cells can be referred to as storage cells. In this disclosure, a NAND flash memory device can also be referred to as a flash device and/or a flash. Since each cell in the flash stores a plurality of bits, each cell needs to distinguish among a large number of voltage levels to identify the corresponding bits. For a QLC, the cell represents 4 bits and needs to distinguish among 16 voltage levels to identify a corresponding bit pattern (e.g., 0101 versus 0100). In other words, the cell needs to uniquely identify 15 threshold voltage levels. This high-density nature of data storage leads to a limited gap between adjacent voltage levels and corresponding tightly distributed threshold voltage levels. However, the data retention capability of the storage cells in the flash device gradually weakens over the lifespan of the storage cells.

As a result, with data retention over a period of time, the threshold voltage distribution can become distorted: the threshold voltage distribution tends to shift and becomes wider. Since the gap between adjacent levels is limited, the distorted threshold voltage distribution overlaps. When the controller of the flash device retrieves data from the cell, the controller may not be able to sense the originally stored data from the overlapping voltage level. As a result, the corresponding data retrieval can become error-prone. In other words, high-density flash devices can suffer high data error rates, which continue to increase with the use of the flash device. Consequently, the ECC scheme of the flash device may not be sufficient after a period of time.

To address this issue, the controller of the flash device needs to change the ECC scheme on-the-fly (i.e., during runtime) to a higher-accuracy ECC (i.e., an ECC that can detect and correct a higher number of bit error rates) than the current one to decrease the overall error rate and bring it below a threshold. To implement this variable-rate ECC scheme, multiple ECC schemes need to be designed and implemented in the flash device. This can lead to increased complexity and higher costs. In addition, the higher-accuracy ECC, which can address a higher error rate, needs more parity bits to be stored. As a result, more storage space in the flash device needs to be dedicated for storing the parity bits. This reduces the effective storage space that can be used to accommodate the user data. Furthermore, with increasing program-erase (PE) cycles, the raw error rate varies among blocks. However, if the controller switches to the higher-accuracy ECC calculation, that could be applicable to all blocks. This can cause inefficient usage of the flash device.

To solve these problems, embodiments described herein provide an enhanced controller for a flash device, such as a NAND flash controller, that can support modulation-assisted error correction for the flash device. The modulation-assisted error correction integrates multi-dimensional modulations and error correction without introducing extra parity. The bits in each storage cell, such as a NAND cell, are divided into different categories. Each category of bits is associated with its own modulation and error correction. Typically, modulation encodes a set of bits into a corresponding signal (e.g., a voltage level). The multi-dimensional modulation increases the distance between the same repeated subset (i.e., the same bit pattern). This leads to lower overlapping in the threshold voltage distribution region and, hence, a reduced error rate.

Suppose that the storage cells in the flash device are TLCs. Then the number of bits stored in a respective cell is three. The 3 bits in a TLC can be in an upper bit (u bit), middle bit (m bit), and lower bit (1 bit) format. In other words, the 3 bits of a TLC can be u-m-1 bits. The multi-dimensional modulation scheme can use two such cells. The lower bits of the 2 cells are used to represent the coordinate of modulation domains. These 2 domain bits can represent 4 such domains. The upper and middle bits from the 2 cells are used to represent a modulation subset. These 4 subset bits can represent 16 possible subsets, each with 4 points (i.e., 4 repetitions of the same subset) that are distributed evenly into 4 domains. In this way, the multi-dimensional modulation scheme divides the modulation into two dimensions.

In some embodiments, the controller can consider the first cell's threshold voltage as a horizontal axis and the second cell's threshold voltage as a vertical axis. The resultant two-dimensional space (i.e., 8 levels by 8 levels) can be divided to map the 64 points represented by the 4 domains and the 16 subsets, each repeated once in each domain. The increased distance between two points (i.e., 2 repetitions) represented by the multi-dimensional modulation scheme can lower the error rate. By increasing the dimension, the modulation scheme maps the points in the same subset as far as possible. Considering the distance as the Euclidean distance between points, the two-dimensional modulation can have a distance $d=\sqrt{(x_1-x_2)^2+(y_1-y_2)^2}$, when the two points have the coordinates of $(x_1, y_1)$ and $(x_2, y_2)$, respectively. The distance for a one-dimensional scheme can be $\sqrt{6}=4$, while the distance for the multi-dimensional scheme can be $\sqrt{17}$. This increased distance can lead to a lower error rate.

To utilize the increased distance, the controller of the flash device can deploy a modulation-assisted ECC (MECC) scheme. As described above, the multi-dimensional modulation scheme increases the inter-subset distance (e.g., the distance between any 2 points of the same subset), hence lowering the corresponding raw error rate. As a result, the domain bits become enhanced with a higher-degree of noise immunity after the modulation. To maintain the intra-subset distance (e.g., the distance between any 2 subsets) no less than the distance before the modulation, MECC deploys a high-accuracy ECC for the subset bits.

However, since the domain bits become enhanced with noise immunity, MECC can use a baseline ECC for the domain bits. The baseline ECC may not be as "strong" as the high-accuracy ECC. In other words, the baseline ECC may not be able to detect as many bit errors as the high-accuracy ECC. For example, for a given bit string, the high-accuracy ECC can detect and correct up to x number of bit errors while the baseline ECC can detect and correct up to (x-y) number of bit errors (x and y are positive integers). However, the enhanced noise immunity allows the controller to use the baseline ECC and perform the necessary level of error correction. In this way, since each point is distributed into one of the domains for all points of a subset, MECC can facilitate enhanced error correction, thereby addressing the threshold voltage distribution issue with data retention without introducing extra parity.

Exemplary System

FIG. 1A illustrates an exemplary infrastructure that facilitates modulation-assisted error correction, in accordance with an embodiment of the present application. In this example, an infrastructure 100 can include a distributed storage system 110. System 110 can include: client servers (or client-serving machines) 102, 104, and 106, and storage servers 112, 114, and 116. Client servers 102, 104, and 106, and storage servers 112, 114, and 116 can communicate with each other via a network 130 (e.g., a local or a wide area network, such as the Internet). A storage server can also include multiple storage devices. For example, storage server 116 can include components such as a central processing unit (CPU) 172, a memory 174 (e.g., a dual in-line memory module), a network interface card (NIC) 176, and a number of storage devices/disks 154, 155, and 156.

Storage device 156 can include one or more high-density flash devices, such as NAND flash device 120. Flash 120 can include a number of storage cells 122, 124, 126, and 128. These cells can be any level cells (e.g., a TLC or a QLC). Suppose that a respective storage cell of flash 120 is a TLC. Then the number of bits stored in a respective cell of flash 120 can be three. The 3 bits in cell 122 can include a u bit 132, an m bit 134, and an 1 bit 136. Similarly, the 3 bits in cell 124 can include a u bit 142, an m bit 144, and an 1 bit 146. In other words, a respective one of cells 122, 124, 126, and 128 can include u-m-1 bits. Flash 120 can include a NAND flash controller 150, which manages data storage, retrieval, and retention operations of flash 120. Such operations can include, but are not limited to, read, write, modulation, error correction, and scheme selection operations.

Figure 1B:
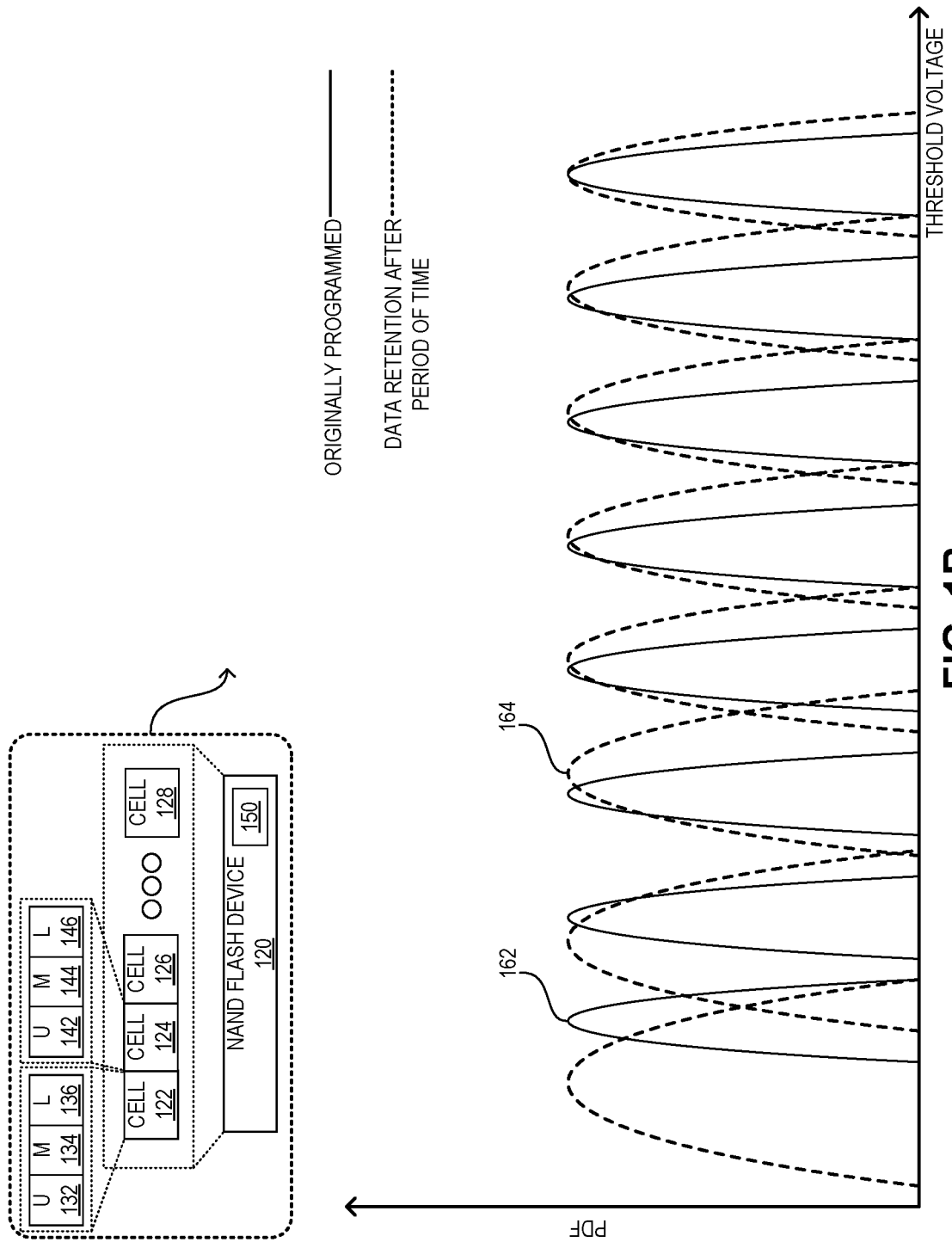
FIG. 1B illustrates an exemplary voltage distribution of a high-density NAND cell with reduced noise margin.

Since each cell in flash 120, such as cell 122, stores a plurality of bits, cell 122 needs to distinguish among a large number of voltage levels to identify the corresponding bits. Controller 150 needs to distinguish among 8 voltage levels to identify a corresponding bit pattern (e.g., 101 versus 100) indicated by the 3 bits in cell 122. In other words, cell 122 needs to uniquely identify 7 threshold voltage levels. This high-density nature of data storage leads to a limited gap between adjacent voltage levels and corresponding tightly distributed threshold voltage levels. FIG. 1B illustrates an exemplary voltage distribution of a high-density NAND cell with reduced noise margin. With existing technologies, the data retention capability of cell 122 gradually weakens over its lifespan.

As a result, with data retention over a period of time, the originally programmed threshold voltage distribution 162 (e.g., a probability density function (PDF)) can become distorted and generate a threshold voltage distribution 164. Threshold voltage distribution 164 tends to shift from distribution 162 and becomes wider compared to distribution 162. Since the gap between adjacent levels is limited, threshold voltage distribution 164 can become significantly overlapping. When controller 150 retrieves data from cell 122, controller 150 may not be able to sense the originally stored data from the overlapping voltage levels. As a result, the corresponding data retrieval can become error-prone. In other words, flash 120 can suffer a high data error rate, which continues to increase with more PE cycles. Consequently, the ECC scheme of flash 120 may not be sufficient after a period of time.

To address this issue, controller 150 may need to change the ECC scheme on-the-fly to a higher-accuracy ECC than the current one to decrease the overall error rate and bring it below a threshold. To implement this variable-rate ECC scheme, multiple ECC schemes need to be designed and implemented in flash 120. This can lead to increased complexity and higher costs. In addition, the higher-accuracy ECC, which can address a higher error rate, needs more parity bits to be stored in flash 120. As a result, more storage space in flash 120 may be dedicated for storing the parity bits. This reduces the effective storage space of flash 120 that can be used to accommodate the user data. Furthermore, with increasing PE cycles, the raw error rate varies among blocks in flash 120. However, if controller 150 switches to the higher-accuracy ECC calculation, that could be applicable to all blocks. This can cause inefficient usage of flash 120.

To solve these problems, controller 150 can facilitate modulation-assisted error correction for flash 120. The modulation-assisted error correction integrates multi-dimensional modulations and error correction without introducing extra parity in flash 120. The bits in each storage cell, cell 122, are divided into different categories. Each category of bits is associated with its own modulation and error correction. The multi-dimensional modulation increases the distance between the points of the same subset. This leads to lower overlapping in the threshold voltage distribution region and, hence, a reduced error rate. The multi-dimensional modulation scheme can be applied to a cell-pair, such as cells 122 and 124. Lower bits 136 and 146 can be used to represent the coordinate of modulation domains. These 2 domain bits can represent 4 such domains. Upper bits 132 and 142, and middle bits 134 and 144 are used to represent a modulation subset. These 4 subset bits can represent 16 possible subsets, each having 4 points that are distributed evenly into 4 domains. In this way, the multi-dimensional modulation scheme divides the modulation into two dimensions.

To utilize the increased distance, controller 150 can deploy a MECC scheme in flash 120. As described above, the multi-dimensional modulation scheme increases the inter-subset distance (e.g., the distance between any 2 points of the same subset), and hence, lowering the corresponding raw error rate. As a result, domain bits 136 and 146 become enhanced with a higher-degree of noise immunity after the modulation. To maintain the intra-subset distance (e.g., the distance between any 2 subsets) no less than the distance before the modulation, MECC deploys a high-accuracy ECC (or a strong ECC) for subset bits 132, 134, 142, and 144. However, since domain bits 136 and 146 become enhanced with noise immunity, MECC can use a baseline ECC for these bits. Because each point is distributed into one of the domains for all points of a subset, MECC can facilitate enhanced error correction, thereby addressing the threshold voltage distribution issue with data retention without introducing extra parity in flash 120.

Multi-Dimensional Space for Bit-Representation

Figure 2A:
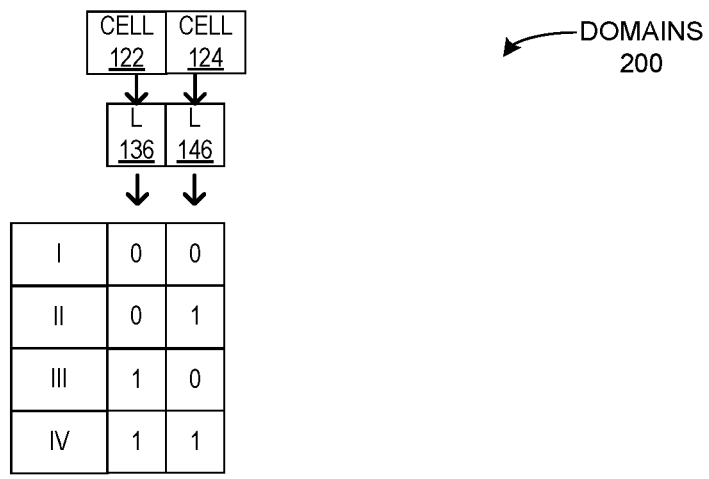
FIG. 2A illustrates an exemplary domain denotation in storage cells for multi-dimensional modulation, in accordance with an embodiment of the present application.

FIG. 2A illustrates an exemplary domain denotation in storage cells for multi-dimensional modulation, in accordance with an embodiment of the present application. Domain bits 136 and 146 can represent 4 domains 200 that include I, II, III, and IV, which can be 00, 01, 10, and 11, respectively. Each of these 4 domains can include a point of each subset. Domain bits 136 and 146 denote the coordinates of domains 200. For example, bits "00" correspond to domain I and denote the coordinate of domain I in the 2-D space created by the voltage levels of cells 122 and 124.

Figure 2B:
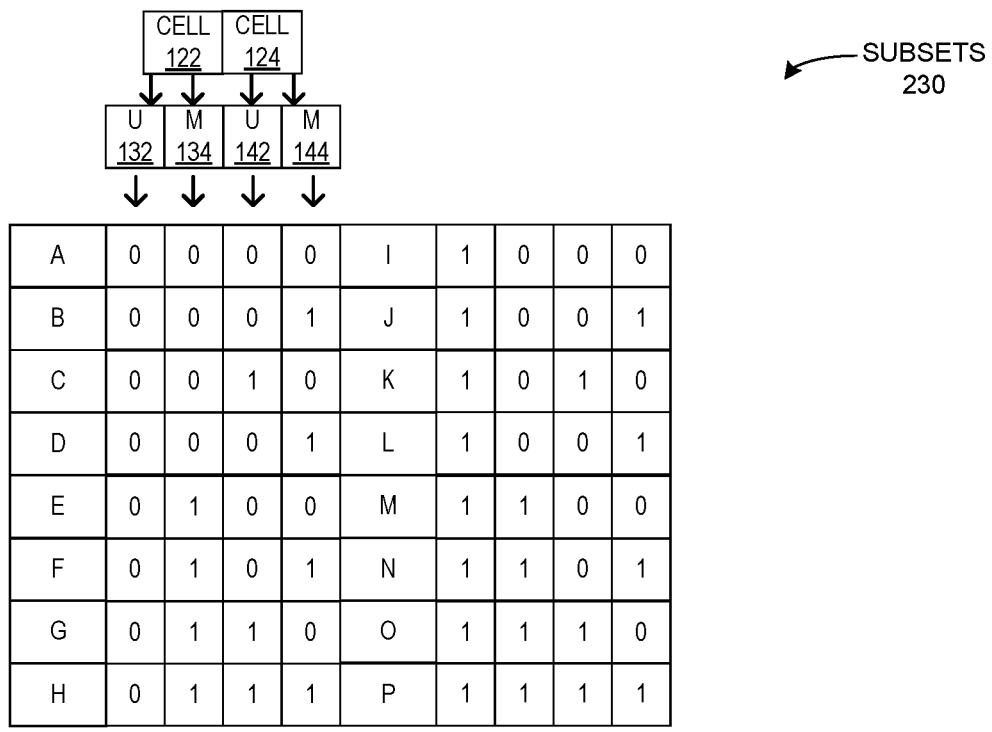
FIG. 2B illustrates an exemplary subset denotation in storage cells for multi-dimensional modulation, in accordance with an embodiment of the present application.

FIG. 2B illustrates an exemplary subset denotation in storage cells for multi-dimensional modulation, in accordance with an embodiment of the present application. Subset bits 132, 134, 142, and 144 can represent 16 subsets 230 that include subsets A-P. Each subset is a specific bit pattern. For example, subset F can correspond to bits "0101" represented by bits 132, 134, 142, and 144, respectively. Since 4 bits of 3+3=6 bits of cells 122 and 124 are used to denote subsets, each subset has 4 points (i.e., is repeated 4 times) for the 4 domains indicated by the remaining 2 bits. These 4 points are evenly distributed among the 4 domains.

Figure 2C:
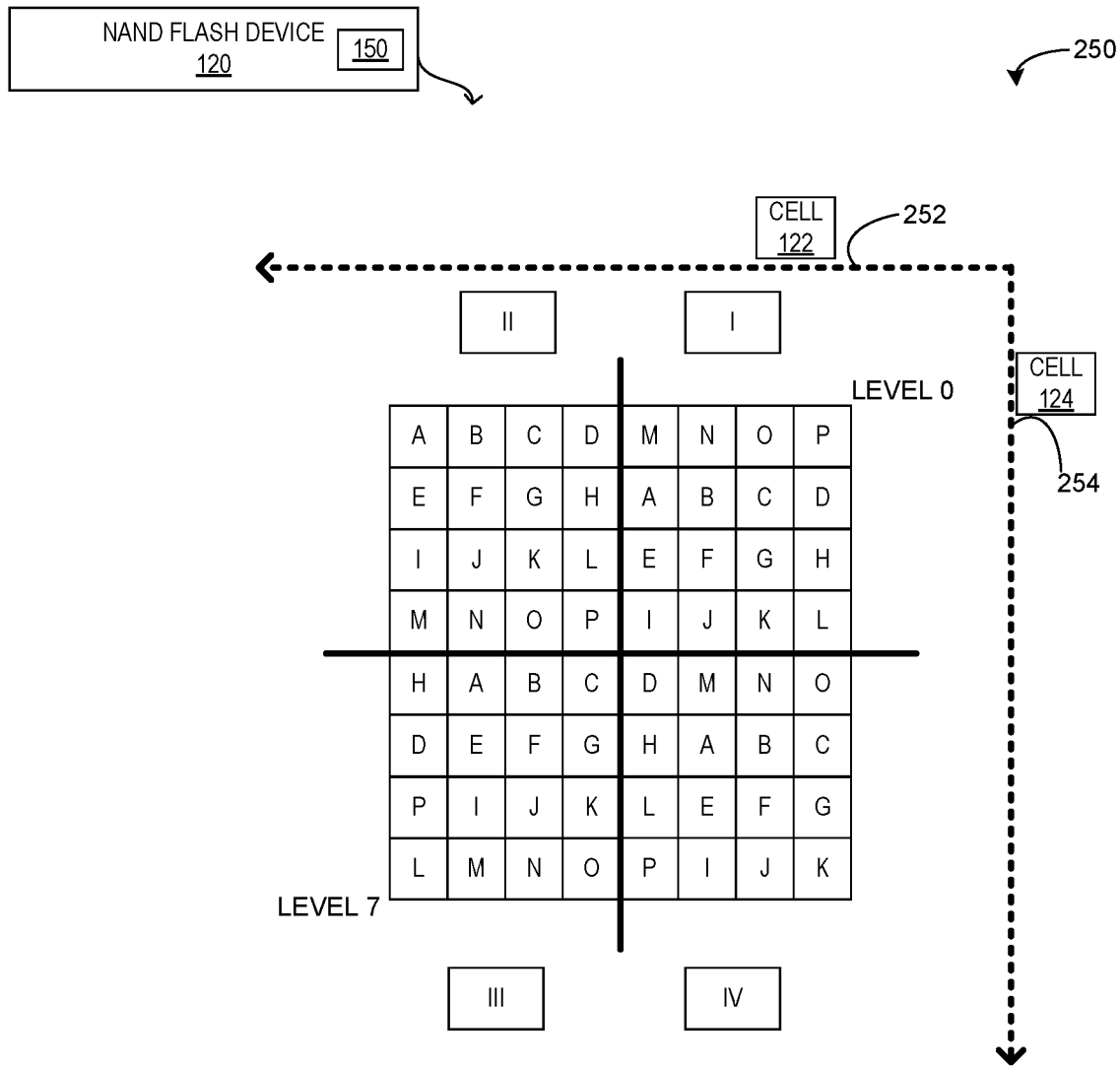
FIG. 2C illustrates an exemplary two-dimensional space for multi-dimensional modulation, in accordance with an embodiment of the present application.
Figure 2C:
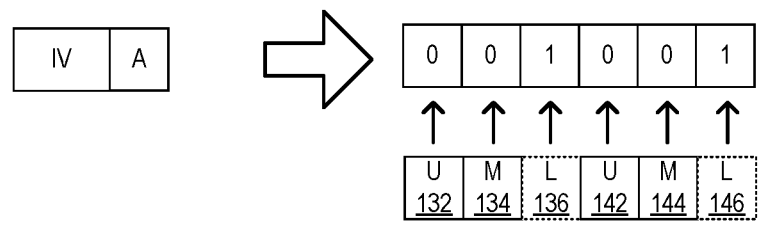

FIG. 2C illustrates an exemplary two-dimensional space for multi-dimensional modulation, in accordance with an embodiment of the present application. In this example, controller 150 can consider cell 122's threshold voltage 252 as a horizontal axis and cell 124's threshold voltage 254 as a vertical axis. Since each of cell 122 and 124 stores 3 bits, each of threshold voltage 252 or 254 includes $2^3=8$ levels (e.g., levels 0-7). The resultant two-dimensional space (i.e., 8 levels by 8 levels) can represent a modulation map 250, which maps the 64 points represented by the 4 domains and the 16 subsets. This multi-dimensional modulation increases the distance between two points of a subset. For example, with 1-D modulation, the distance between two points of subset A can be $\sqrt{16}=4$. However, with the multi-dimensional modulation, the distance between the two points of subset A can be $\sqrt{17}$. This increased distance between two points can lower the error rate.

As described in conjunction with FIGS. 2A and 2B, the four points of subset A are evenly distributed in the 4 domains. Suppose that controller 150 intends to program bits "000001" in cells 122 and 124. Subset A is denoted by "0000" in bits 132, 134, 142, and 144, respectively, and domain IV is denoted by "11" in bits 136 and 146, respectively. Hence, bits "001001" are programmed in cells 122 and 124 as subset A in domain IV. In other words, in the 8-by-8 2-D space represented by threshold voltage 252 and threshold voltage 254, subset A in domain IV can be indicated by level 2 of threshold voltage 252 and level 5 of threshold voltage 254 starting from 0. In the same way, subset A in domain II can be indicated by level 7 of threshold voltage 252 and level 0 of threshold voltage 254.

Modulation-Assisted Error Correction

Figure 3:
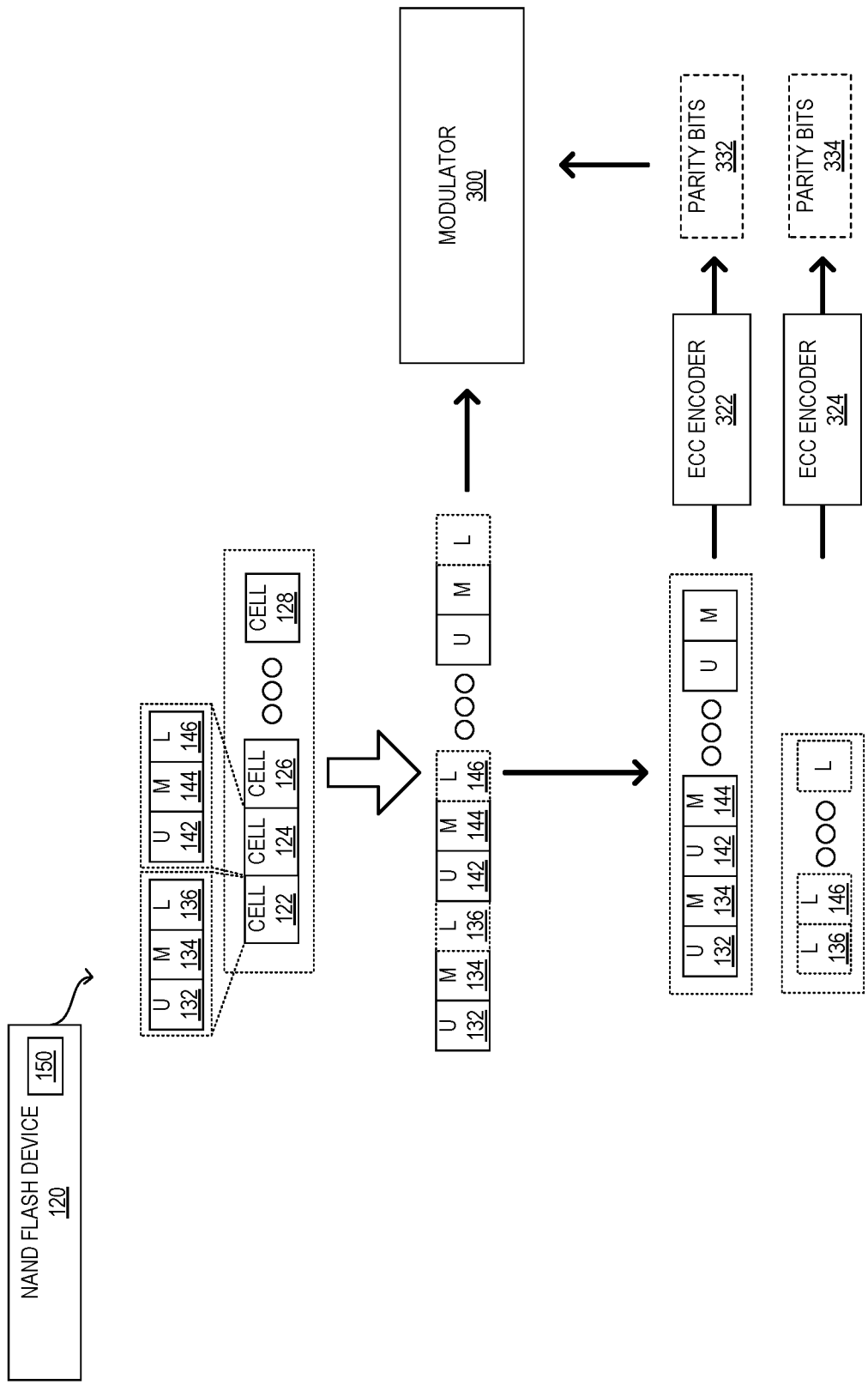
FIG. 3 illustrates exemplary data storage based on modulation-assisted error correction, in accordance with an embodiment of the present application.

FIG. 3 illustrates exemplary data storage based on modulation-assisted error correction, in accordance with an embodiment of the present application. In this example, controller 150 can include a modulator 300 that is capable of facilitating multi-dimensional modulation. Modulator 300 can generate the corresponding voltage levels for cells 122 and 124 in such a way that the 6 bits programmed in cells 122 and 124 are one of the 64 possible combinations. For example, to program bits "001001" in cells 122 and 124, modulator 300 programs "0000" in subset bits 132, 134, 142, and 144, respectively, and "11" in domain bits 136 and 146, respectively.

To do so, modulator 300 can modulate cell 122 with a voltage level 2 of the 8 levels and cell 124 with a voltage level 5 of the 8 levels. On the other hand, to program bits "001001" in cells 122 and 124, modulator 300 programs "0000" in subset bits 132, 134, 142, and 144, respectively, and "11" in domain bits 136 and 146, respectively. To do so, modulator 300 can modulate cell 122 with a voltage level 5 and cell 124 with a voltage level 2. This modulation increases the distance between the points of subset A (i.e., the subset of "0000," as described in conjunction with FIG. 2B). Therefore, the bits for domain denotation naturally get enhanced noise immunity after the modulation.

To utilize the increased distance between the points of subset A, controller 150 can deploy the MECC scheme. To facilitate the MECC scheme, controller 150 can include at least two ECC encoders 322 and 324. Encoder 322 can encode bits with a high-accuracy ECC and encoder 324 can encode bits with a baseline ECC. Since domain bits 136 and 146 become enhanced with noise immunity, controller 150 can use ECC encoder 324 for bits 136 and 146, and generate corresponding parity bits 334.

On the other hand, to maintain the intra-subset distance (e.g., the distance between any 2 subsets) no less than the distance before the modulation, controller 150 can use ECC encoder 324 for bits 132, 134, 142, and 144, and generate corresponding parity bits 334. Because each point of the subset is distributed into one of the domains and the domains are enhanced with noise immunity, even with distorted threshold voltage levels, as described in conjunction with FIG. 1A, parity bits 332 and 334 are sufficient to recover the bits stored in cells 122 and 124.

Figure 4:
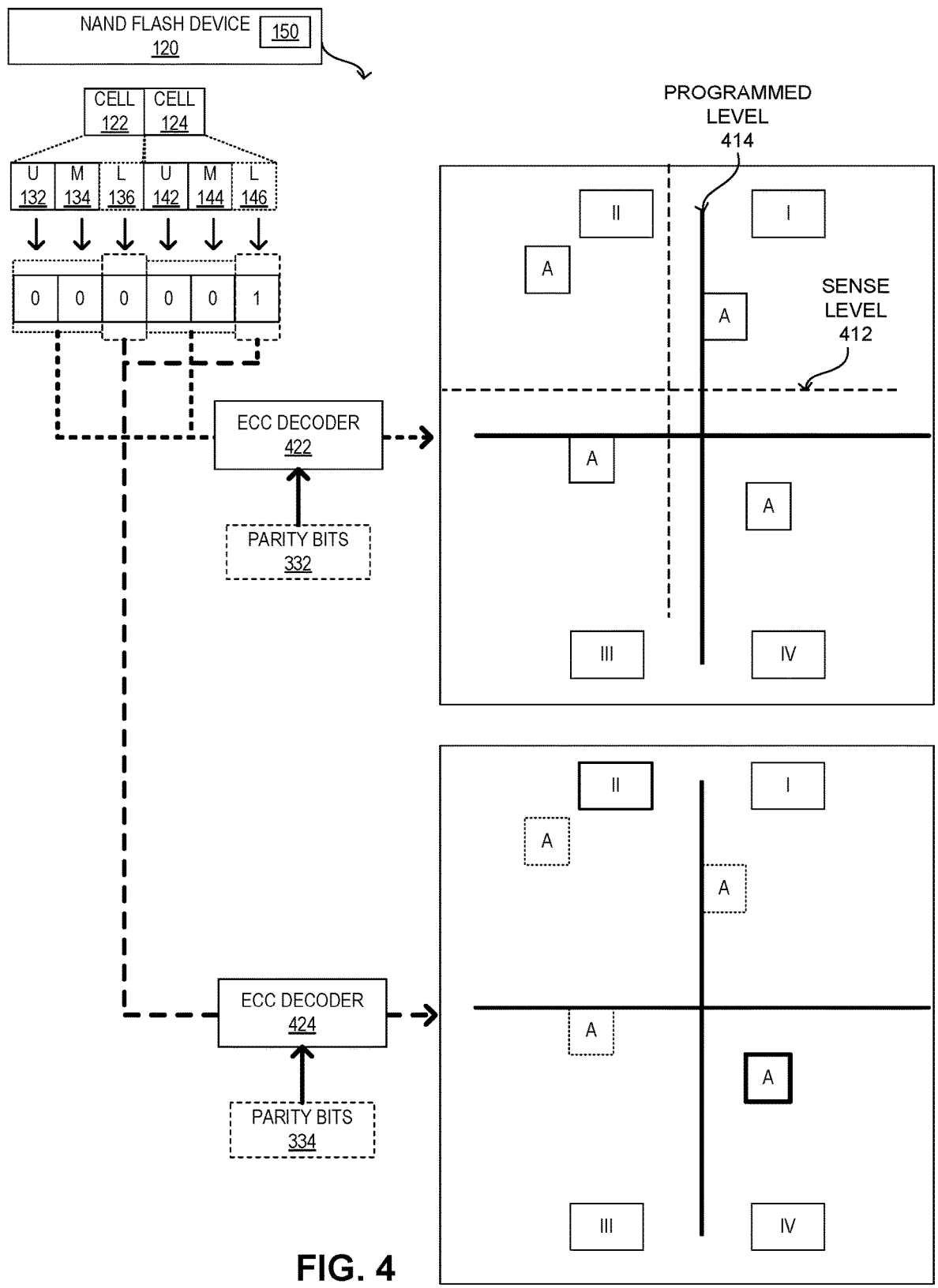
FIG. 4 illustrates exemplary data retrieval based on modulation-assisted error correction, in accordance with an embodiment of the present application.

FIG. 4 illustrates exemplary data retrieval based on modulation-assisted error correction, in accordance with an embodiment of the present application. Since controller 150 performs the modulation for both cells 122 and 124 for storing data, controller 150 can also read from both cells 122 and 124. To perform the read operation, controller 150 divides the read result into 2 groups. The first group can include bits 132, 134, 142, and 144, and the second group can include bits 136 and 146. In this example, controller 150 can include ECC decoders 422 and 424. Decoder 422 can decode bits with the high-accuracy ECC corresponding to encoder 322 and decoder 424 can decode bits with the baseline ECC corresponding to encoder 324. Controller 150 can use decoder 422 to decode the first group. This allows controller 150 to determine which subset the programmed data belongs to. For example, if the first group is "0000," controller 150 can determine that the decoded data corresponds to subset A.

Since the distance among the points of the subset is large, even when the programmed level 414 can be shifted from sense level 412, decoder 422 can still determine the four points of the subset based on parity bits 332. Here, sense level 412 can indicate the threshold voltage level controller 150 is expected to sense, and programmed level 414 can indicate the threshold voltage level of the cells in flash 120 for data retention over a period of time. In this way, controller 150 can still sense the correct points with a low error rate without needing to switch to a higher-strength ECC on-the-fly.

In other words, since the distance is large among the 4 points of the subset indicated by bits 132, 134, 142, and 144, the error rate can be low. Furthermore, the domains indicated by bits 136 and 146 have only 4 distinct levels. As a result, the corresponding decoding of the second group can be relatively less complex. Therefore, the second group can be protected with parity bits 334, which can include a fewer number of bits than in parity bits 332. Controller 150 can use decoder 424 to decode the second group to determine the domain of the subset based on parity bits 334. For example, if the second group is "11," controller 150 can determine that the decoded subset A corresponds to domain IV. In this way, when controller 150 determines the point in the 2-D space generated by sense level 412 for cells 122 and 124, controller 150 can check the corresponding modulation map (e.g., modulation map 250 in FIG. 2C) to determine the 6 bits from cells 122 and 124.

Figure 5:
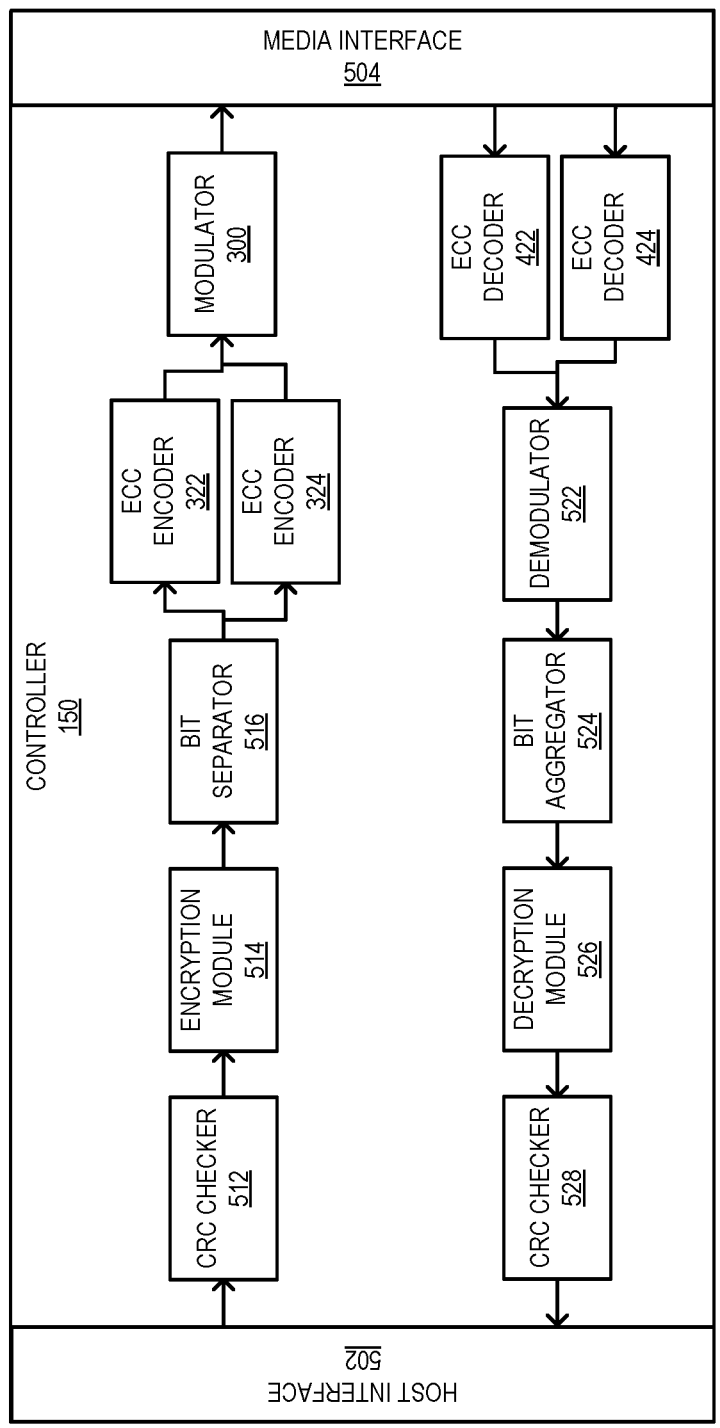
FIG. 5 illustrates an exemplary architecture of a controller of a flash device supporting modulation-assisted error correction, in accordance with an embodiment of the present application.

FIG. 5 illustrates an exemplary architecture of a controller of a flash device supporting modulation-assisted error correction, in accordance with an embodiment of the present application. Controller 150 can include a host interface 502 for communicating with the host device and obtaining user data, and a media interface 504 for storing the modulated data in the storage cells. During a write operation, controller 150 first performs a cyclic-redundancy check (CRC) on any incoming user data received via host interface 502 using a CRC checker 512. This allows controller 150 to detect any error in the user data. Encryption module 514 then encrypts the user data based on an on-chip encryption mechanism, such as a self-encrypting mechanism for flash memory.

A bit separator 516 separates the bits from a cell into a first group and a second group for subset denotation and domain denotation, respectively. In the example in FIG. 4, bits 132 and 134 of cell 122 are grouped into the first group, and bit 136 of cell 122 is grouped into the second group. Controller 150 then encodes the first group with encoder 322 and the second group with encoder 324 to generate the corresponding parity bits. Controller 150 then programs the user bits and the parity bits into the cells using modulator 300. This programming includes setting the respective voltage levels of the cells based on the modulation map (e.g., modulation map 250 in FIG. 2C).

Similarly, to read from the cells, controller 150 obtains programmed data via media interface 504. Decoders 422 and 424 then perform ECC decoding on the subset bits and domain bits, respectively. Since the multi-dimensional modulation increases the distance between two points of a subset, decoder 422 can still decode the subset with shifted programmed level 414 due to data retention over a period of time. This allows controller 150 to avoid switching to a higher-accuracy ECC encoding mechanism. Upon decoding, demodulator 522 demodulates the decoded user data to generate the corresponding domain and subset bits. Bit aggregator 524 aggregates the bits to generate corresponding user data bits. For example, bit aggregator 524 can aggregate subset bits "0000" with domain bits "11" to generate user data bits "001001" stored in a cell-pair. Decryption module 526 can decrypt the on-chip encryption on the user data. CRC checker 528 then performs a CRC check on the decrypted user data to ensure the data is error-free. Controller 150 provides that user data to the user (i.e., the host machine) via host interface 502.

Reduced-Dimension Modulation

Figure 6A:
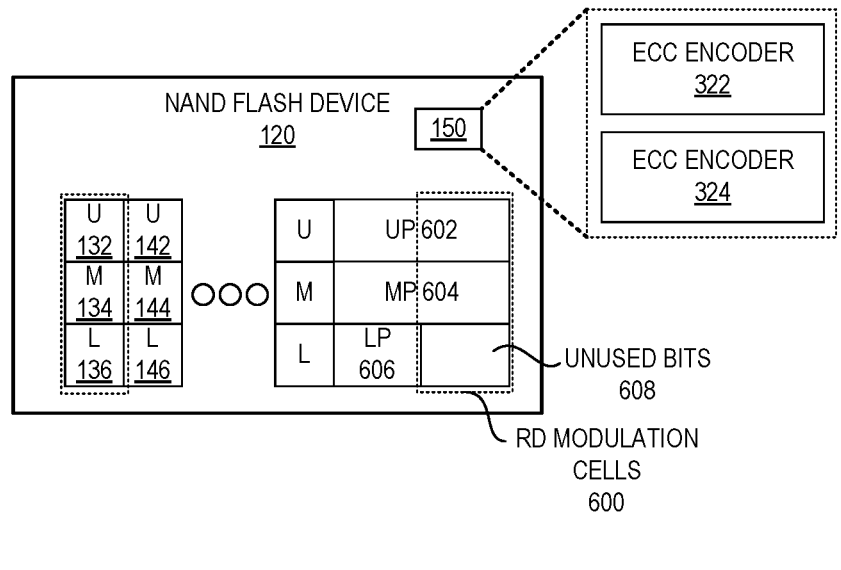
FIG. 6A illustrates an exemplary reduced-dimension (RD) modulation that utilizes parity difference of modulation-assisted error-correction, in accordance with an embodiment of the present application.
Figure 6A:
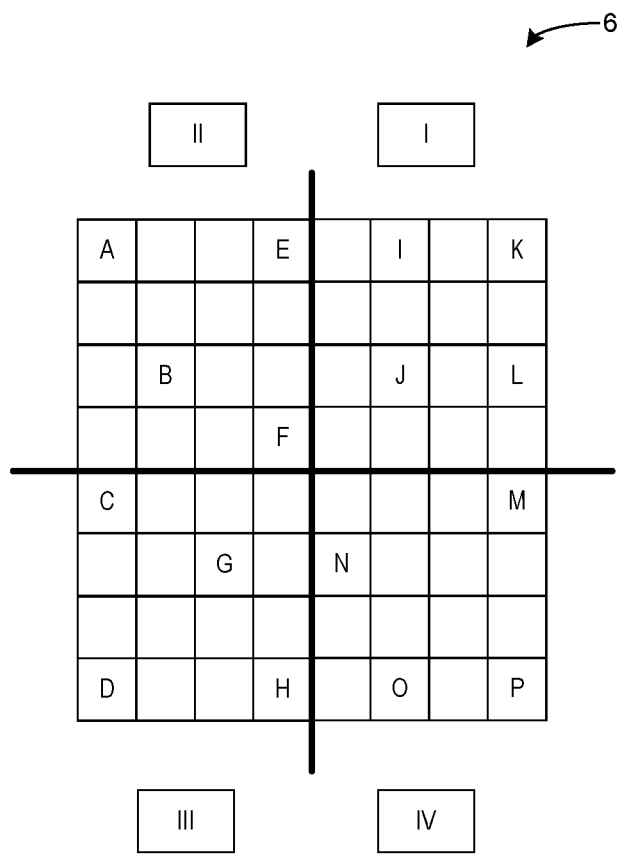

FIG. 6A illustrates an exemplary RD modulation that utilizes parity difference of modulation-assisted error-correction, in accordance with an embodiment of the present application. At the early stage of flash 120's lifespan, encoder 322 uses the higher-accuracy ECC encoding and encoder 324 uses the baseline ECC encoding. As a result, the number of parity bits generated by encoder 322 can be higher than the same of encoder 324. For instance, in the example in FIG. 3, parity bits 332 can be larger than parity bits 334. Flash 120 can store the parity bits in out-of-band (OOB) cells (i.e., the cells not used for storing user data). These OOB cells can also be TLCs and include an upper parity bit, a middle parity bit, and a lower parity bit.

Since the parity bits for upper and middle bits of a respective storage cell are encoded by encoder 322, the resultant parity bits may match the number of upper and middle parity bits in the OOB cells. However, the parity bits for the lower bits of a respective storage cell are encoded by encoder 324. As a result, the number of parity bits for the lower bits can be fewer than the number of lower parity bits in the OOB cells. For example, upper parity bits 602 and middle parity bits 604 of the OOB cells may match the number of parity bits generated by encoder 322 for the upper and middle bits in the storage cells used for storing user data. However, the number of parity bits generated by encoder 324 for the lower bits in the storage cells can be fewer than the lower parity bits 606 of the OOB cells. Hence, a number of bits in parity bits 606 may remain unused and can be referred to as unused bits 608. In other words, a number of cells in the OOB cells only use 2 bits, and the other bit remains in unused bits 608. These cells can be referred to as RD modulation cells 600.

To avoid modulating (or prune) unused bits 608, controller 150 can use an RD modulation that modulates the 2 bits in upper parity bits 602 and middle parity bits 604 of cells 600. Similar to the multi-dimensional modulation, RD modulation can modulate 2 OOB cells. Consequently, RD modulation can use 4 bits in upper parity bits 602 and middle parity bits 604 to denote 16 points A-P similar to 16 subsets 230. The 2-D space corresponding to the 8-by-8 voltage levels of the 2 OOB cells can generate 64 possible combinations. Controller 150 generates an RD modulation map 610 by mapping the 16 points to 16 positions out of the 64 positions. In some embodiments, controller 150 can select the 16 positions in such a way that the average distance between two points is increased, which can lead to a reduced error rate. Because of unused bits 608, controller 150 only needs to program 16 points instead of 64.

Figure 6B:
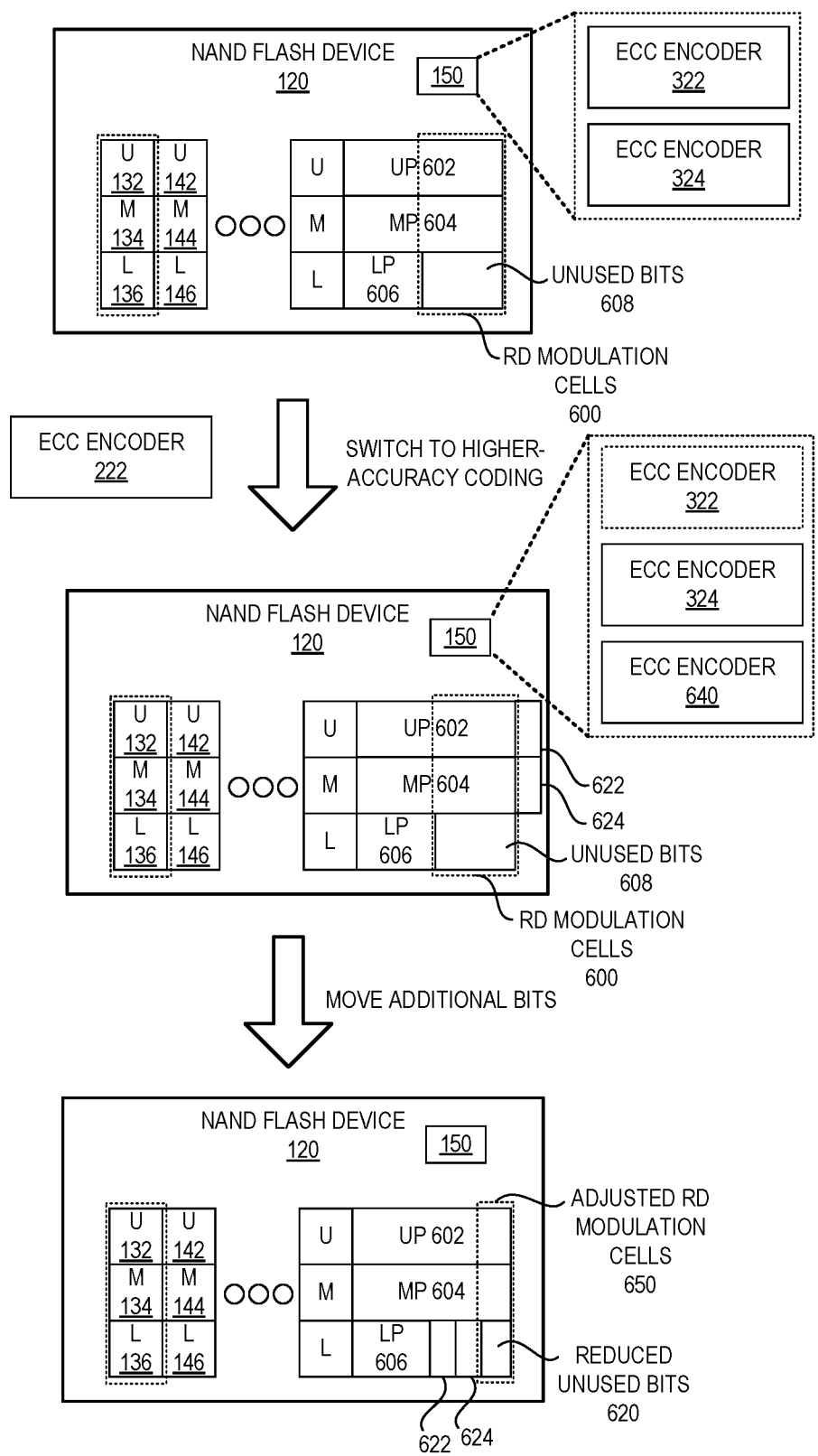
FIG. 6B illustrates an exemplary parity-bit management using RD modulation, in accordance with an embodiment of the present application.

At a later stage of flash 120's lifespan, the multi-dimensional modulation and MECC scheme may not be sufficient to facilitate error correction in flash 120. However, the pruning of unused bits 608 allows controller 150 to efficiently manage parity bits to accommodate higher-accuracy ECC. FIG. 6B illustrates an exemplary parity-bit management using RD modulation, in accordance with an embodiment of the present application. With a large number of PE cycles, the error correction facilitated by encoder 322 may not be sufficient. Controller 150 can then switch to a higher-accuracy ECC than the ECC provided by encoder 322 to maintain the advantage of MECC.

In some embodiments, controller 150 can be equipped with an ECC encoder 640 capable of providing the higher-accuracy ECC. Controller 150 can then disable encoder 322 (denoted with dotted lines) and enable encoder 640 to switch to the higher-accuracy ECC. However, encoder 640 may generate a higher number of parity bits compared to that of encoder 322. The additional parity bits 622 and 624 may exceed the memory space originally accommodated in OOB cells. As a result, parity bits 622 and 624 can overflow. To address the overflow issue, controller 150 can move parity bits 622 and 624 to unused bits 608. In this way, controller 150 can still switch to a higher-priority ECC without allocating data cells that were previously allocated for user data for parity bits.

It should be noted that the enhanced noisy immunity from the multi-dimensional modulation provides a low error rate to the domain bits. Hence, the baseline ECC provided by encoder 324 would still be sufficient to protect the domain bits. As a result, even when controller 150 switches to encoder 640, unused bits 608 remain available to accommodate the overflow bits. Upon accommodating parity bits 622 and 624, the remaining storage space in unused bits 608 becomes reduced unused bits 620. Controller 150 then adjusts RD modulation cells 600 in upper parity bits 602 and middle parity bits 604 to correspond to unused bits 620. These adjusted RD modulation cells 650 can still include OOB cell-pairs for which RD modulation mapping 610 can be used.

Operations

Figure 7A:
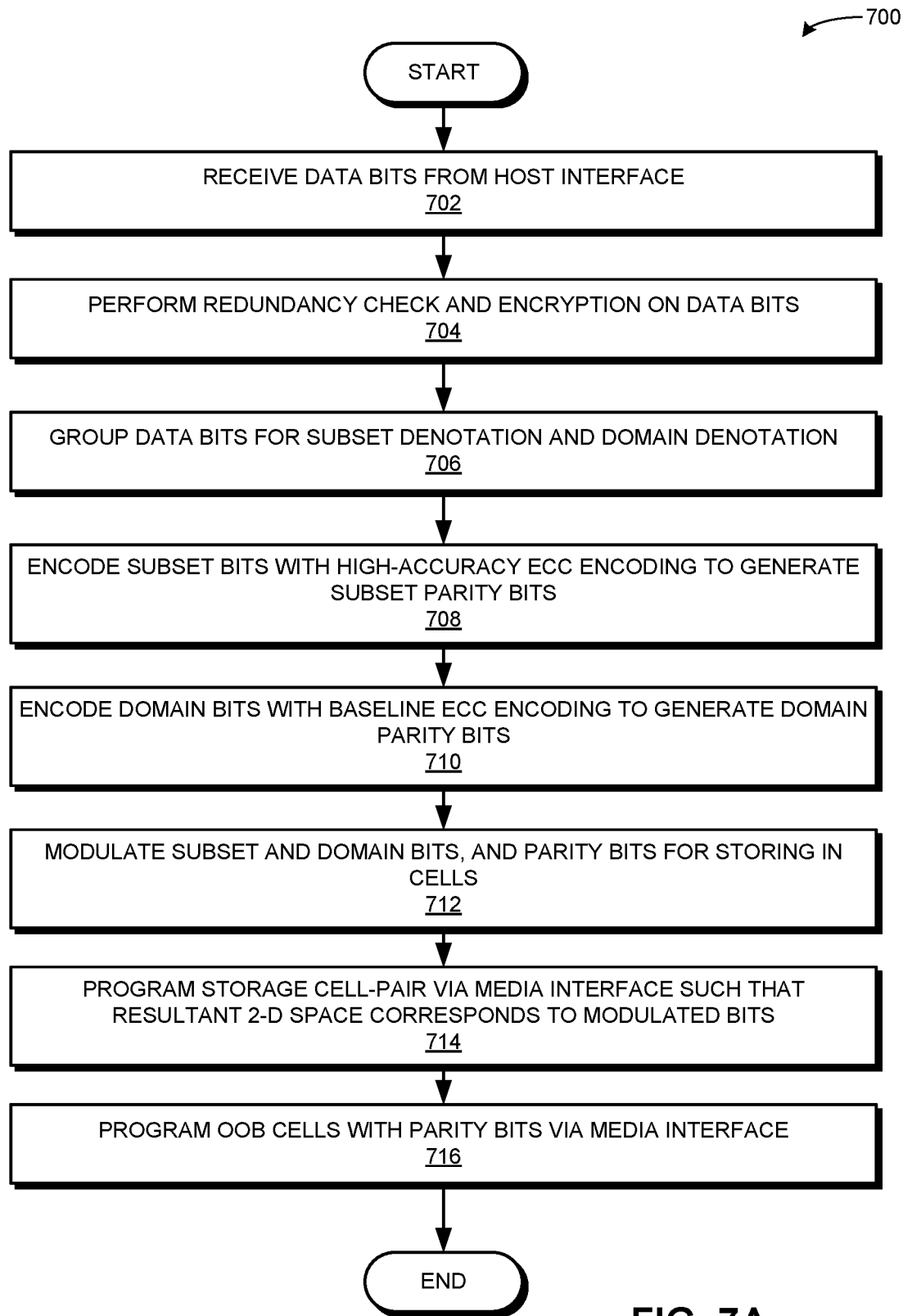
FIG. 7A presents a flowchart illustrating a method of the controller of a flash device storing data based on modulation-assisted error correction, in accordance with an embodiment of the present application.

FIG. 7A presents a flowchart 700 illustrating a method of the controller of a flash device storing data based on modulation-assisted error correction, in accordance with an embodiment of the present application. During operation, the controller receives data bits from the host interface (operation 702), and performs a redundancy check and encryption on the data bits (operation 704). The controller then groups the data bits for subset denotation and domain denotation (operation 706). The controller can encode the subset bits with a high-accuracy ECC encoding to generate subset parity bits (operation 708).

The controller can also encode the domain bits with baseline ECC encoding to generate domain parity bits (operation 710). The controller modulates the subset and domain bits, and the parity bits for storing in cells (operation 712). The controller then programs a storage cell-pair via the media interface such that the resultant 2-D space corresponds to modulated bits (operation 714). The controller also programs OOB cells with the parity bits via the media interface (operation 716).

Figure 7B:
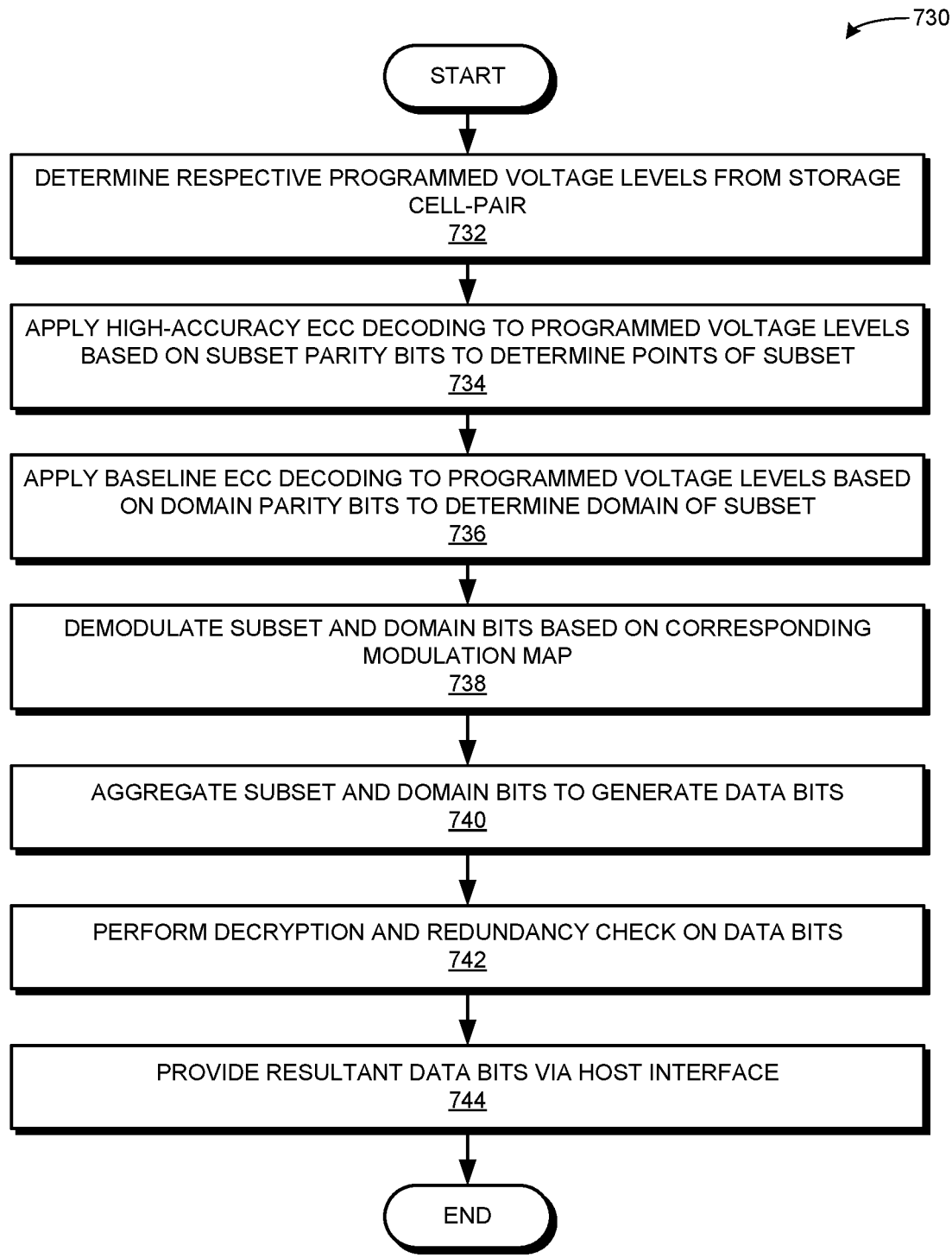
FIG. 7B presents a flowchart illustrating a method of the controller of a flash device retrieving data based on modulation-assisted error correction, in accordance with an embodiment of the present application.

FIG. 7B presents a flowchart 730 illustrating a method of the controller of a flash device retrieving data based on modulation-assisted error correction, in accordance with an embodiment of the present application. During operation, the controller determines respective programmed voltage levels from a storage cell-pair (operation 732). The controller applies a high-accuracy ECC decoding to the programmed voltage levels based on the subset parity bits to determine the points of a subset (operation 734). For example, for 4 domains, this operation can provide the 4 points of the subset, as described in conjunction with FIG. 4.

The controller then applies a baseline ECC decoding to the programmed voltage levels based on the domain parity bits to determine the domain of the subset (operation 736). The controller demodulates the subset and domain bits based on the corresponding modulation map (operation 738), and aggregates the subset and domain bits to generate the data bits (operation 740). The controller then performs decryption and redundancy check on the data bits (operation 742), and provides the resultant data bits via the host interface (operation 744).

Figure 7C:
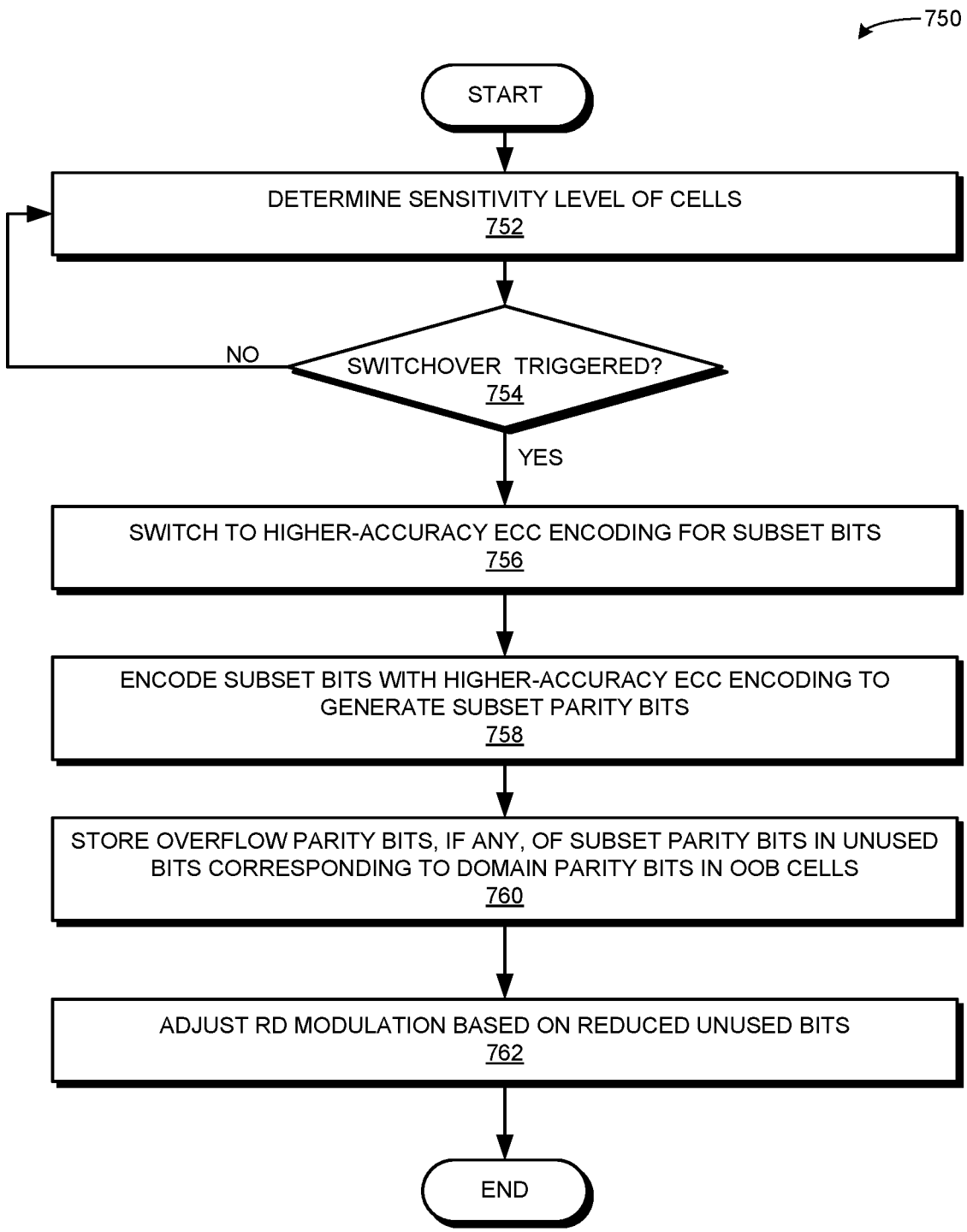
FIG. 7C presents a flowchart illustrating a method of the controller of a flash device storing overflow parity bits based on RD modulation, in accordance with an embodiment of the present application.

FIG. 7C presents a flowchart 750 illustrating a method of the controller of a flash device storing overflow parity bits based on RD modulation, in accordance with an embodiment of the present application. During operation, the controller determines the sensitivity levels of the cells (operation 752). The sensitivity levels can indicate whether the controller can correctly sense the programmed data in the cells. The controller then checks whether a switchover has been triggered (operation 754). A switchover can trigger if the controller can no longer correctly sense the subset bits from the programmed cells. If a switchover is not triggered, the controller continues to determine the sensitivity levels of the cells (operation 752).

On the other hand, if a switchover is triggered, the controller can switch to a higher-accuracy ECC encoding for the subset bits (operation 756). In some embodiments, the controller can perform the switchover by enabling an encoder capable of performing the higher-accuracy ECC encoding. The controller then encodes the subset bits with the higher-accuracy ECC encoding to generate the subset parity bits (operation 758). The controller can store the overflow parity bits, if any, of the subset parity bits in the unused bits corresponding to the domain parity bits in the OOB cells (operation 760). The controller then adjusts the RD modulation based on the reduced unused bits (operation 762).

Exemplary Computer System and Apparatus

Figure 8:
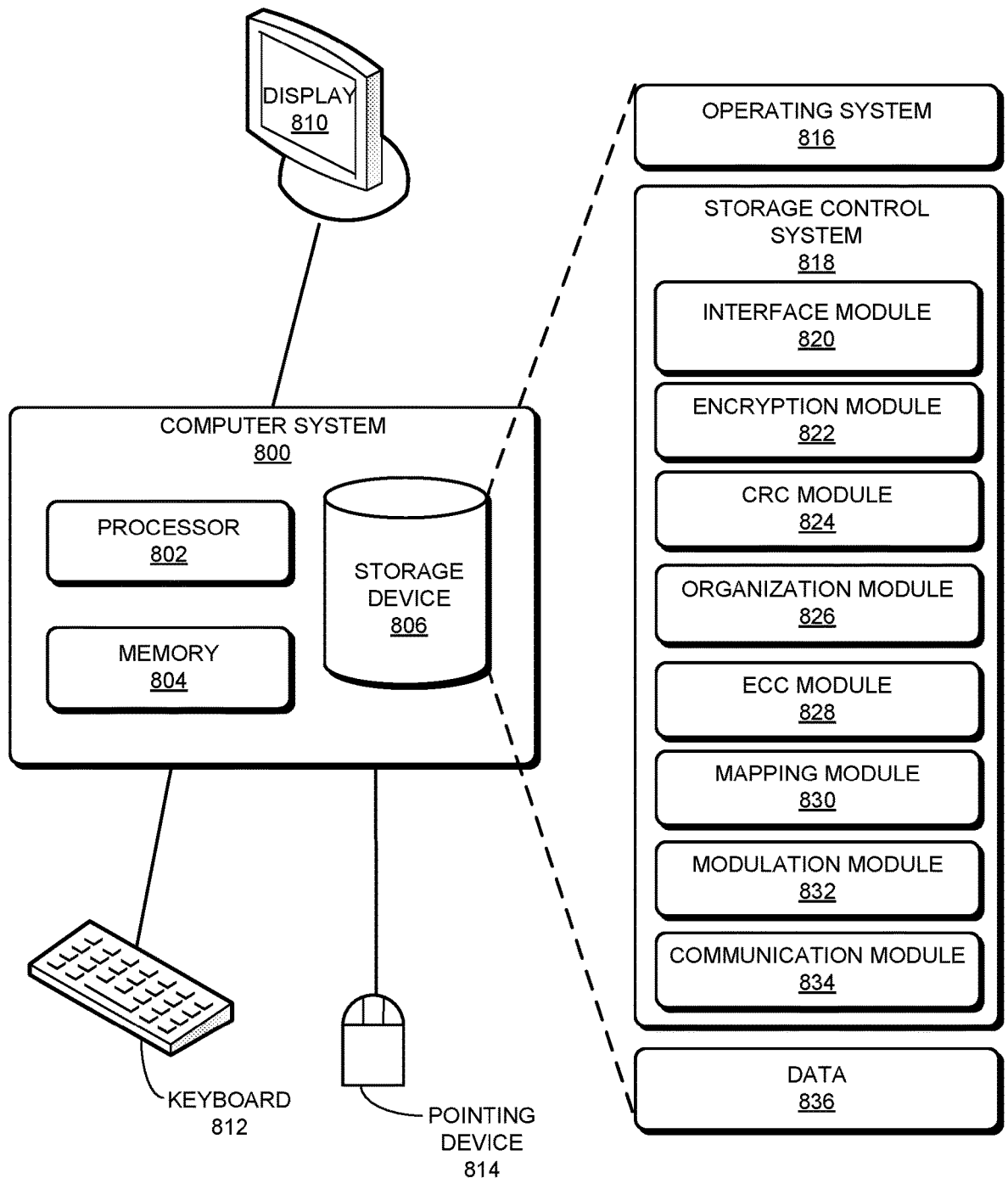
FIG. 8 illustrates an exemplary computer system that facilitates modulation-assisted error correction, in accordance with an embodiment of the present application.

FIG. 8 illustrates an exemplary computer system that facilitates modulation-assisted error correction, in accordance with an embodiment of the present application. Computer system 800 includes a processor 802, a memory 804, and a storage device 806. Memory 804 can include a volatile memory (e.g., a dual in-line memory module (DIMM)). Furthermore, computer system 800 can be coupled to a display device 810, a keyboard 812, and a pointing device 814. Storage device 808 can store an operating system 816, a storage control system 818, and data 836. Storage control system 818 can facilitate the operations of controller 150, as described in conjunction with FIG. 5.

Storage control system 818 can include instructions, which when executed by computer system 800 can cause computer system 800 to perform methods and/or processes described in this disclosure. Specifically, storage control system 818 can include instructions for obtaining data from and providing data to a host machine (interface module 820). Storage control system 818 can also include instructions for programming data in and retrieving/sensing programmed data from storage cells (e.g., NAND cells) (interface module 820). Furthermore, storage control system 818 includes instructions for encrypting and/or decrypting data (encryption module 822) and performing CRC checks on the data (CRC module 824).

Moreover, storage control system 818 includes instructions for organizing (e.g., grouping and/or aggregating) bits from storage cells into subset and domain bits (organization module 826). Storage control system 818 further includes instructions for performing the MECC scheme, which can include using a high-accuracy ECC for the subset bits and a baseline ECC for the domain bits (ECC module 828). Storage control system 818 can include instructions for mapping the subset and domain bits to the voltage levels of the corresponding storage cells and generating the corresponding modulation map (mapping module 830). Storage control system 818 can also include instructions for mapping the upper and middle parity bits to the voltage levels of the corresponding RD modulations cells and generating the corresponding RD modulation map (mapping module 830).

In addition, storage control system 818 includes instructions for performing the multi-dimensional modulation and programming the one or more storage cells based on the corresponding modulation mapping (modulation module 832). Storage control system 818 also includes instructions for performing the RD modulation and programming the one or more RD modulation cells based on the corresponding RD modulation mapping (modulation module 832). Storage control system 818 also includes instructions for programming the OOB cells with parity bits generated by the MECC scheme (modulation module 832). Storage control system 818 may further include instructions for sending and receiving messages (communication module 834). Data 836 can include any data that can facilitate the operations of controller 150, such as modulation mapping 250 and RD modulation mapping 610.

Figure 9:
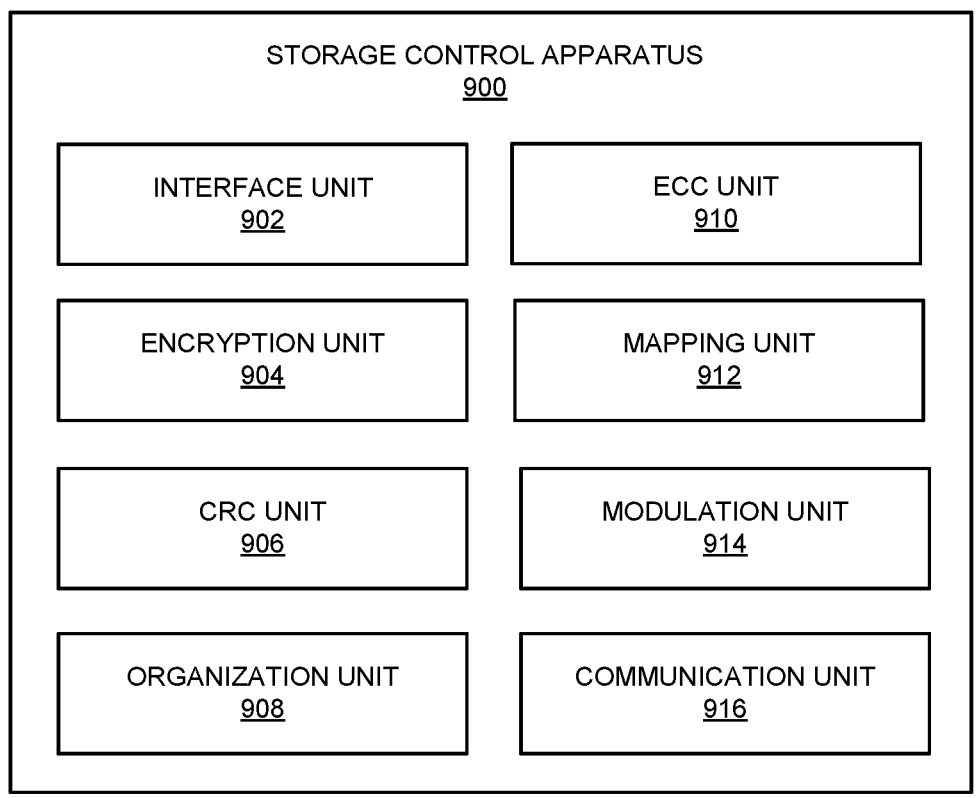
FIG. 9 illustrates an exemplary apparatus that facilitates modulation-assisted error correction, in accordance with an embodiment of the present application.

FIG. 9 illustrates an exemplary apparatus that facilitates modulation-assisted error correction, in accordance with an embodiment of the present application. Storage control apparatus 900 can comprise a plurality of units or apparatuses which may communicate with one another via a wired, wireless, quantum light, or electrical communication channel. Apparatus 900 may be realized using one or more integrated circuits, and may include fewer or more units or apparatuses than those shown in FIG. 9. Further, apparatus 900 may be integrated in a computer system, or realized as a separate device that is capable of communicating with other computer systems and/or devices. Specifically, apparatus 900 can comprise units 902-916, which perform functions or operations similar to modules 820-834 of computer system 800 of FIG. 8, including: an interface unit 902; an encryption unit 904; a CRC unit 906; an organization unit 908; an ECC unit 910; a mapping unit 912; a modulation unit 914; and a communication unit 916.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disks, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. An apparatus, comprising:
   a plurality of flash memory cells;
   an organization module configured to group bits of a cluster of cells in the plurality of flash memory cells into a first group and a second group, wherein a respective of the first and second groups includes bits from a respective cell of the cluster of cells;
   a mapping module configured to generate a modulation map that maps a subset of bits indicated by the first group in such a way that the subset of bits is repeated in a respective domain of bits indicated by the second group; and
   a modulation module configured to program user data bits in the cluster of cells based on the modulation map.

2. The apparatus of claim 1, wherein a number of dimensions of the modulation map corresponds to the number of cells in the cluster, and wherein a respective dimension of the modulation map corresponds to a voltage level of a cell of the cluster.

3. The apparatus of claim 2, wherein programming the user data bits further comprises:
   determining a point corresponding to the user data bits in the modulation map; and
   programming the voltage level of a respective cell in the cluster based on the point.

4. The apparatus of claim 1, further comprising an error-correction module configured to apply a first error-correction coding (ECC) to a first subset of bits of the user data bits that are modulated for the first group and a second ECC to a second subset of bits of the user data bits that are modulated for the second group, wherein the first ECC is configured to detect and correct a higher bit error rate than that of the second ECC.

5. The apparatus of claim 4, wherein the modulation module is further configured to read the first subset of bits from the cluster of cells based on the first ECC, wherein the programmed voltage levels have become overlapping due to data retention over a period of time.

6. The apparatus of claim 4, wherein the first ECC is configured to generate a first set of parity bits for the first subset of bits and the second ECC is configured to generate a second set of parity bits for the second subset of bits, and wherein the number of bits in the second set of parity bits is lower than that of the first set of parity bits.

7. The apparatus of claim 6, further comprising a plurality of out-of-band (OOB) flash memory cells distinct from the plurality of flash memory cells;
wherein the modulation module is further configured to program one or more cells of the plurality of the OOB flash memory cells to store the first and second sets of parity bits.

8. The apparatus of claim 7, wherein the modulation module is further configured to:
switch from the first ECC to a third ECC in response to determining a bit error rate higher than the capability of the first ECC;
apply the third ECC to the first subset of bits of the user data bits to generate a third set of parity bits for the first subset of bits; and
store an overflow bit of the third set of parity bits in an empty bit in a cell of the OOB flash memory cells.

9. The apparatus of claim 1, wherein a respective cell of the plurality of flash memory cells is one of: a triple-level cell (TLC) and a quad-level cell (QLC), and wherein the cluster of cells includes at least two cells.

10. The apparatus of claim 1, wherein the modulation map is a two-dimensional map, wherein voltage levels of the first cell of the cluster of cells indicate an x axis of the modulation map and voltage levels of the second cell of the cluster of cells indicate a y axis of the modulation map.

11. A control system of a flash memory device, comprising:
interface circuitry configured to communicate with a plurality of flash memory cells of the flash memory device; and
control circuitry configured to:
group bits of a cluster of cells in the plurality of flash memory cells into a first group and a second group, wherein a respective of the first and second groups includes bits from a respective cell of the cluster of cells;
generate a modulation map that maps a subset of bits indicated by the first group in such a way that the subset of bits is repeated in a respective domain of bits indicated by the second group; and
program user data bits in the cluster of cells based on the modulation map via the interface circuitry.

12. The control system of claim 11, wherein a number of dimensions of the modulation map corresponds to the number of cells in the cluster, and wherein a respective dimension of the modulation map corresponds to a voltage level of a cell of the cluster.

13. The control system of claim 12, wherein programming the user data bits further comprises:
determining a point corresponding to the user data bits in the modulation map; and
programming the voltage level of a respective cell in the cluster based on the point.

14. The control system of claim 11, wherein the control circuitry is further configured to apply a first error-correction coding (ECC) to a first subset of bits of the user data bits that are modulated for the first group and a second ECC to a second subset of bits of the user data bits that are modulated for the second group, wherein the first ECC is configured to detect and correct a higher bit error rate than that of the second ECC.

15. The control system of claim 14, wherein the control circuitry is further configured to read the first subset of bits from the cluster of cells based on the first ECC, wherein the programmed voltage levels have become overlapping due to data retention over a period of time.

16. The control system of claim 14, wherein the first ECC is configured to generate a first set of parity bits for the first subset of bits and the second ECC is configured to generate a second set of parity bits for the second subset of bits, and wherein the number of bits in the second set of parity bits is lower than that of the first set of parity bits.

17. The control system of claim 16, wherein the flash memory device further comprises a plurality of out-of-band (OOB) flash memory cells distinct from the plurality of flash memory cells; and
wherein the control circuitry is further configured to program one or more cells of the plurality of the OOB flash memory cells to store the first and second sets of parity bits.

18. The control system of claim 17, wherein the control circuitry is further configured to:
switch from the first ECC to a third ECC in response to determining a bit error rate higher than the capability of the first ECC;
apply the third ECC to the first subset of bits of the user data bits to generate a third set of parity bits for the first subset of bits; and
store an overflow bit of the third set of parity bits in an empty bit in a cell of the OOB flash memory cells.

19. The control system of claim 11, wherein a respective cell of the plurality of flash memory cells is one of: a triple-level cell (TLC) and a quad-level cell (QLC), and wherein the cluster of cells includes at least two cells.

20. The control system of claim 11, wherein the modulation map is a two-dimensional map, wherein voltage levels of the first cell of the cluster of cells indicate an x axis of the modulation map and voltage levels of the second cell of the cluster of cells indicate a y axis of the modulation map.

* * * * *